United States Patent
Huang

(10) Patent No.: US 9,429,449 B2
(45) Date of Patent: Aug. 30, 2016

(54) SENSOR HAVING MULTIPLE MAGNETIC BLOCKS OF UNEVENLY DISTRIBUTED MAGNETIC FLUXES IN HOUSING

(71) Applicants: CHENGDU KUANHE TECHNOLOGY CO., LTD., Chengdu, Sichuan (CN); Qiang Huang, Chengdu, Sichuan (CN); Song Gao, Chengdu, Sichuan (CN); Yanxiong Ouyang, Chengdu, Sichuan (CN)

(72) Inventor: Qiang Huang, Sichuan (CN)

(73) Assignees: CHENGDU KUANHE TECHNOLOGY CO., LTD., Chengdu, Sichuan (CN); Qiang Huang, Chengdu, Sichuan (CN); Song Gao, Chengdu, Sichuan (CN); Yanxiong Ouyang, Chengdu, Sichuan (CN)

( * ) Notice: Subject to any disclaimer, the term of this patent is extended or adjusted under 35 U.S.C. 154(b) by 0 days.

(21) Appl. No.: 14/417,790

(22) PCT Filed: Jun. 5, 2013

(86) PCT No.: PCT/CN2013/076773
§ 371 (c)(1),
(2) Date: Jan. 28, 2015

(87) PCT Pub. No.: WO2014/019405
PCT Pub. Date: Feb. 6, 2014

(65) Prior Publication Data
US 2015/0211893 A1    Jul. 30, 2015

(30) Foreign Application Priority Data

Jul. 28, 2012 (CN) .......................... 2012 1 0263503

(51) Int. Cl.
| | | |
|---|---|---|
| G01D 5/14 | (2006.01) |
| G01D 5/245 | (2006.01) |
| G01P 3/487 | (2006.01) |
| G01L 3/10 | (2006.01) |
| G01D 5/20 | (2006.01) |
| H03M 1/66 | (2006.01) |

(52) U.S. Cl.
CPC ................ *G01D 5/145* (2013.01); *G01D 5/20* (2013.01); *G01D 5/2451* (2013.01); *G01L 3/101* (2013.01); *G01P 3/487* (2013.01); *H03M 1/66* (2013.01)

(58) Field of Classification Search
CPC combination set(s) only.
See application file for complete search history.

(56) References Cited

U.S. PATENT DOCUMENTS

2009/0001970 A1* 1/2009 Tokunaga ............ G01D 5/2451
324/207.21

* cited by examiner

*Primary Examiner* — Clayton E Laballe
*Assistant Examiner* — Jas Sanghera

(57) ABSTRACT

A sensor having multiple magnetic blocks of unevenly distributed magnetic fluxes in a housing includes, sequentially connected, a sensing element, a power-assisted model processor (21), a digital-to-analog converter (27), and an operational amplifier (28). The sensing element includes a rotating disk (1) and an annular-groove fixing disk (40) fitted therewith. Multiple permanent magnetic blocks (2) are fixedly arranged on the rotating disk (1) in a circular-annular distribution, and at least two of the permanent magnetic blocks (2) are different in magnetic fluxes. On a certain side of the rotating disk (1), the magnetic polarities of all of the permanent magnetic blocks (2) on the certain side of the rotating disk (1) are distributed in a pattern of pole N, pole S, pole N . . . ; a Hall element (3) on the fixing disk (40) is arranged at a position which is close to the permanent magnetic blocks (2).

20 Claims, 5 Drawing Sheets

SENSOR HAVING MULTIPLE MAGNETIC BLOCKS OF UNEVENLY DISTRIBUTED MAGNETIC FLUXES IN HOUSING

CROSS REFERENCE OF RELATED APPLICATION

This is a U.S. National Stage under 35 U.S.C 371 of the International Application PCT/CN2013/076773, filed Jun. 5, 2013, which claims priority under 35 U.S.C. 119(a-d) to CN 201210263503.9, filed Jul. 28, 2012.

BACKGROUND OF THE PRESENT INVENTION

1. Field of Invention

The present invention relates to the technical field of the magnetic induction providing signal, and more particularly to the technology of multi-point magnetic induction providing control signal on a rotating part.

2. Description of Related Arts

A Chinese patent application having an application number of CN 201020295192.0 by Yebao automotive materials Industry Co. Ltd disclosed a power-assist bicycle dedicated sensing device which is cooperated by a magnetic part and a flexible assembly and capable of sensing torque. After a long time utilization, changes of spring constants of the flexible assembly lead to changes of control effects of the sensing signal and the controlled motor, so that the control effects can not meet the requirements of people's assistance. In addition, the flexible assembly has a complicated structure and a high cost.

A Chinese patent application "automatic detection device for electric-assist bicycle" with a publication number of 01201843.0 by Beijing University of Science and Technology discloses an automatic detection device for an electric-assist bicycle. The device detects the pedal force, the speed and the steering without contacting. In the device, discs are respectively provided on an inner wheel disc and an outer wheel disc which moves relatively. A spring is provided on the inner wheel disc. The spring is provided between the inner wheel disc and the outer wheel disc for resetting. Two Hall elements on a support detect electrical signals generated by relatively moved discs on the inner wheel disc and the outer wheel disc to represent the pedal force, the speed and the steering.

Disadvantages of the devices mentioned above are as follows.

Disadvantage (1)

The flexible assembly utilized is not durable. After a time of utilization, changes of spring constant of the flexible assembly lead to control effect changes of the controlled motor, so that the control effects can not meet the requirements of people's assistance. In addition, the flexible assembly has a complicated structure and a high cost.

Disadvantage (2)

Disc groups are the same and magnetic poles thereof are arranged in the same way, wherein positions of different disc groups and special power assistance requirements of different positions cannot be represented. Referring to FIGS. 3, 4, 5 and 6 as well as the second paragraph of the second page of the patent application 01201843.0, magnetic poles of each disc group (comprising a disc 4, a disc 5, and a disc 6) are arranged in the same way, i.e. disc groups same with each other are simply and repeatedly placed at different positions of the inner wheel, which can not represent the positions of different disc groups and moving states of a specific position. During riding, moving pedal and the corresponding positions thereof have their own power assistance requirements. However, according to the patent application 01201843.0, each disc groups are the same, which cannot represent special power assistance requirements of the pedal on different positions.

Disadvantage (3)

Each point signal has no difference, in such a manner that machine does not match human: disc groups are the same, so each disc group cannot represent the position thereof on the inner wheel, and the output signal of the Hall element can not represent positions of the pedals and the other disc groups. That is to say, the output signal of the Hall element can not represent the power assistance requirements of the pedals at different positions, in such a manner that the power assistance requirement does not match the power assistance time, namely unsatisfactory man-machine coordination.

Disadvantage (4)

The sinusoidal wave outputted allow a disc group edge distance of not less than 4 cm, and preferably 5 cm, which causes a result that the number of the magnetic sheet groups are too few and that the man-machine cooperation is not satisfying. If each group of magnetic sheets is identical, the output of the Hall element is sinusoidal waves for serving as the control signal. The sinusoidal waves serving as the control signal must have a peak-valley difference value. Since the magnetic sheet group in the application needs a certain length for representing the forward and reverse movement. The circular path of the annular-groove rotating disk with a diameter of 20 cm has at most 8 magnetic sheet groups provided thereon, and preferably 5, in such a manner that the Hall element is capable of generating sinusoidal wave signals having control function. In other words, when the technical solution of the patent application of 01201843.0 is utilized in a power-assist bicycle, the number of the magnetic sheet groups is limited to 8, the number of the control signal is too few and the man-machine cooperation is not satisfying. However, if the magnetic sheet groups are more than 8, the signal graph outputted by the Hall element is close to a horizontal line when a man rides on the bicycle in a fast speed. The signal does not have a control function and is not capable of controlling the motor, so that when the assist power is particularly required, the power-assist function is lost.

Disadvantage (5)

The blind zone of the signal has a blind angle of 45 degrees, and the assist power can not be obtained when required in starting. It is well known that the torque is minimal when a man steps on the pedal vertex of a bicycle. An area 10-45 degrees away from the vertex is the area requiring the assist power most. However, in the patent application, the included angle among each magnetic sheet group is 45 degrees. The area 10-45 degrees away from the vertex of the pedal has no magnetic sheet group, i.e., no control signal. And the result is that the motor of the power-assist bicycle is not capable of providing assist power while requiring the assist power most.

In summary, except that the flexible assembly is not durable and has complicated structures, the diameter of the wheel is within 20 cm, which limits the number of the magnetic sheet group to 8. Thus, the groups of the magnetic sheets can not be added optionally, the man-machine cooperation is the satisfying, the assist power is not available while starting. The assist power can not meet the requirements. The cyclist is not comfortable while riding. If the number of the magnetic sheet groups is added forcibly, the sensing signals thereof loose the assist power control function.

A Chinese patent application sensor for time-like electric power bicycle having a publication number of 03264387.X by Naikang Wang discloses a sensor without a flexible assembly. The sensor comprises a rotating disc and a stationary disc. Two permanent magnets are inset in the rotating disc. Three Hall elements are inset in the stationary disc. When the pedal of the bicycle rotates one cycle, each Hall element generates two pulses, and thus three Hall elements generate six pulses. Three features and four disadvantages of the patent application by Naikang Wang are analyzed as follows.

Feature (1)

In order to obtain six pulse signals, the same magnetic poles of the two permanent magnets are provided on a same side of the rotating disc, i.e., both the north poles and the south poles of the two permanent magnets are on a certain side of the rotating disc. If a north pole of one permanent magnet and a south pole of another permanent magnet are on a same side of the rotating disc, each Hall element is only capable of generating one pulse by rotating the pedal one circle, and the three Hall element is only capable of generating three pulses, which is not in accordance with the disclosure of the specification of the patent application. In order to increase the pulses and the control effect, the same magnet poles of each permanent magnet can only be on an identical side.

Feature (2)

The permanent magnets are for presenting stationary positions of the pedal. The three Hall elements are for presenting motion positions of the pedal. Since the pedal and the rotating disk rotate synchronously, one permanent magnet is respectively provided on two positions of the rotating disc corresponding to the two pedals. The rotating position of a pedal is the rotating position of a corresponding permanent magnet. However, only when the rotating at the position of the Hall element, can the Hall element send a control signal, by which to instruct the power-assist bicycle to generate the assist power to rotate.

Feature (3)

Since one Hall element is not capable of representing the motion positions in one rotating circle of the pedal at different times, utilizing only one Hall element is not desirable. The pedal has a great different requirement for the assist power at different times of the rotating circle. In order to represent the variations of requirements for the assist power, three Hall elements are respectively provided on three positions within 180 degrees in the patent application. Two permanent magnets are respectively provided on the positions of the pedal. The pedal rotates in a position of the Hall element, and the Hall element outputs signals for representing that the pedal reaches the position of the Hall element. However, utilizing multiple Hall elements has disadvantages as follows.

The features of the sensor of the power-assisted bicycle have three disadvantages as follows.

Disadvantage (1)

Two identical permanent magnets respectively represent stationary positions of the two pedals. Multiple Hall elements are utilized for representing the rotating position of the pedals. The two identical permanent magnets have advantages that the stationary positions of the two pedals can be represented respectively with no differences between the left foot and the right foot. The left foot and the right foot have requirements for the assist power and are capable of generating the same assist effects to the motors. The disadvantage is that the permanent magnet itself is not capable of representing the rotating position of the pedal, and the rotating position of the pedal can only be represented by the positions of the multiple Hall elements provided on different corner positions. Thus, utilizing only one Hall element is infeasible, and multiple Hall elements must be utilized.

Disadvantage (2)

As utilizing one Hall element is infeasible, utilizing three Hall elements inevitably leads to original segment errors of three control signals, which causes distortion of the required power assist model, so that the output of the assist power is not in accordance with the requirements of the assist power. No matter the power-assist bicycle has one motor or two motors, the motor signals controlled thereby can only achieve the object of controlling the motor by only one controller of sensing signal inputting motor. However, in the patent application, three Hall elements are utilized for controlling the motor, so only when the three control signals of the three Hall elements are combined into an integrated control signal, the control signal can be inputted to the motor controller. Sensor parameters of the three Hall elements can't be the identical. Particularly, due to variations of the environment temperatures, the sensor parameters of the three Hall elements may have great differences, which cause an result that different Hall elements output different voltages under the same power assist requirements. Thus, the motor generates different outputs of assist power, and the output of the assist power id not in accordance with the requirements for the assist power. Similarly, when identical assist power is required, different Hall elements may output an identical voltage, so that the motor generates only one identical assist power to output, which also brings the problem of inconformity between the outputs and the requirements of the assist power.

Disadvantage (3)

The integrated control signal is easy to generate a signal drift, so that the integrated control signal does not match with the motor controller and that the power assist model is distorted. Due to variations of the environment temperatures, the sensor parameters of the three Hall elements may have great differences after utilizing for a long time, which certainly leads to variations of three control signals of the three Hall elements, so that the integrated control signal generated by an identical power assist requirement generates a segment signal drift. Thus the integrated control signal as a whole generates the segment signal drift, i.e. the assist power model is distorted, which causes a result that no matter the motor controller selects any one of the three control signal for serving as a reference, the problems of inconformity between the requirements and the outputs of the assist power.

Disadvantage (4)

Sensing sites can not be added randomly. The number of the sensing sites is too few, so that the operation of the motor is unstable and the rider feels uncomfortable. Since the disadvantages (1) and (2) are caused by the fact that the number of the Hall elements is over one, the more is the number of the Hall element, the more serious is the disadvantages (1) and (2). Thus, the power assist bicycle provided by the patent application is a power assist bicycle that makes the rider feels uncomfortable.

Disadvantage (5)

The blind zone of the signal has a blind angle of 45 degrees, and the assist power can not be obtained when required in starting. It is well known that the torque is minimal when a man steps on the pedal vertex of a bicycle.

An area 10-45 degrees away from the vertex is the area requiring the assist power most. However, in the patent application, the included angle among each magnetic sheet group is 42.5-43.5 degrees. The area 10-42 degrees away from the vertex of the pedal has no Hall elements, i.e., no control signal. And the result is that the motor of the power-assist bicycle is not capable of providing assist power while requiring the assist power most.

In summary, the patent application adopts a technical solution of controlling the power assist model by multiple Hall elements. Since the rotating positions of the pedal can only be presented by multiple Hall elements, the multiple Hall elements controlled signals must have original errors; and the integrated control signal is easy to generate signal drift. Both of the situations cause distortion of the assist power required model, i.e., the identical power assist requirements at different times obtains different power assist effects. The more is the number of the Hall elements, the more serious is the distortion degree of the power assist required model, which limits the number of the Hall elements. The few amounts of the Hall elements cause a result that the operation of the motor is not steady, the rider feels uncomfortable, and that the assist power is not available when starting. Thus, the patent application by Naikang Wang always attends to one thing and loses sight of another between the distortionless of the power assist requirement model and the steady operation of the motor, and it is not possible to have both ways.

SUMMARY OF THE PRESENT INVENTION

An object of the present invention is to provide a sensor which is capable of obtaining the speed and position signals and digitizing the signals to output the best power assistance model signal only by a Hall element and the magnetic flux changes of each of the permanent magnetic blocks on the annular-groove rotating disk; and within the Hall element inductive region, is capable of increasing the number of permanent magnetic blocks as many as possible, maximizing the use of displacement information of the annular-groove rotating disk, outputting more information and accurately positioning, wherein the Hall element and a plurality of permanent magnetic blocks are fixed to a relative position by an assembly. When the sensor of the present invention is applied to the power assistance bicycle, even if no elastic element and other machines determine the torque, the power assistance demand and the power assistance provided match well, and the motor stably operates.

The conception of the present invention is: within the Hall element inductive range, the pole N and the pole S are alternated on one surface of an annular-groove rotating disk where a plurality of permanent magnetic blocks face the Hall element for allowing the Hall element to induct moving signals of all of the permanent magnetic blocks. The permanent magnetic blocks change in magnetic polarities and fluxes for allowing the Hall element to acquire the moving signals of the multiple permanent magnetic blocks with specific and more accurate locations, much stronger control function and more quantity. The alternation of the pole N and the pole S of the permanent magnetic blocks allows the Hall element to generate rectangular waves for acquiring signals with much stronger control function and more quantity; magnetic flux changes of the multiple permanent magnetic blocks allow the Hall element to generate signals which are capable of more accurately expressing positions of the multiple permanent magnetic blocks, so that the moving state of a specific position of the annular-groove rotating disk is able to be expressed. Due to the moving state of a pedal directly expresses a power assistance demand state of a rider to the power assistance bicycle, it is very important for the power assistance bicycle to express what the moving state of the specific position of a pedal is.

The relative position of the Hall sensing element and the multiple permanent magnetic blocks is fixed by the assembly of a mechanical structure for acquiring stable and reliable sensing signals of the Hall element.

The rectangular wave signals outputted by the Hall element are converted to digital signals, which is convenient for digitizing the digital signals of the Hall element, a power assistance mathematical model capable of allowing the best coordination of the person and the machine may be added during the digitalization, the power assistance mathematical model is able to be randomly adjusted according to the people machine coordination. Therefore, the present invention overcomes the problem that sine wave signals outputted by a Hall element in the prior art are not easy to be digitized, but simulated and the randomly adjustable power assistance model can not be added; the problem that only the power assistance model limited by speed signals is extracted; and the problem that the people is not able to best coordinated with the machine.

The structure of the present invention is described as follows.

A sensor having multiple magnetic blocks of unevenly distributed magnetic fluxes in a housing comprises a sensing element, a power assistance model processor 21, a digital-to-analog converter 27 and an operational amplifier 28 connected in sequence, and is characterized in that:

[1] the sensing element is adapted for transforming rotational motions of an annular-groove rotating disk 1 to rectangular wave output signals;

wherein the sensing element comprises the annular-groove rotating disk 1, an annular-groove fixing disk 40, a Hall element 3 and a plurality of permanent magnetic blocks 2; a concave of the annular-groove rotating disk 1 is opposite to that of the annular-groove fixing disk 40, and the annular-groove fixing disk 40 is engaged with an annular groove of the annular-groove rotating disk 1 to form a fitting interior-empty housing in which two disks are capable of relatively rotating with each other, the concave of the annular-groove rotating disk 1 and that of the annular-groove fixing disk 40 form a hollow ring 41; the plurality of permanent magnetic blocks 2 are fixedly arranged on a portion of the annular-groove rotating disk 1 within the hollow ring 41, and the plurality of permanent magnetic blocks 2 are evenly distributed along a circular trajectory, that is to say, that a distance from each of the permanent magnetic blocks 2 to a circle center of the circular trajectory 5 is same, and a distance between every two adjacent permanent magnetic blocks 2 is same; magnetic polarities of every two adjacent permanent magnetic blocks 2 are opposite, the magnetic polarities of all of the permanent magnetic blocks 2 on the annular-groove rotating disk 1 are distributed in a pattern of pole N, pole S, pole N, pole S, pole N, pole S . . . ; magnetic fluxes of at least two of the permanent magnetic blocks 2 are different;

the Hall element 3 is fixedly located on a portion of the annular-groove fixing disk 40 within the hollow ring 41, and is located at a position which is close to the permanent magnetic blocks 2 and capable of inducting the magnetic flux of each of the permanent magnetic blocks 2, a distance is provided between the Hall element 3 and the permanent magnetic blocks 2; the Hall element 3 is adapted for generating the rectangular wave output signals aiming at two opposite magnetic polarities;

[2] the power assistance model processor 21 is a signal form converter adapted for converting rotating digital signals of the annular-groove rotating disk 1 to power assistance model digital signals;

wherein the power assistance model processor 21 comprises an analog-to-digital converting and wave peak recognizing device 22, a power assistance starting point selector 23, a magnetic block rotation rate calculator 24, a power assistance model storage 25 and a power assistance model calculator 26;

the analog-to-digital converting and wave peak recognizing device 22 connected with the sensing element recognizes a wave peak of each of the rectangular waves inputted by the Hall element 3 of the sensing element, converts each of the rectangular wave signals to various digital signals, marks each of the rectangular waves, and outputs magnetic block moving digital signals marked with positions and orders of the magnetic blocks;

the analog-to-digital converting and wave peak recognizing device 22 is connected with the power assistance starting point selector 23 and the magnetic block rotation rate calculator 24, the power assistance starting point selector 23 is connected with the magnetic block rotation rate calculator 24; the magnetic block rotation rate calculator 24 calculates rotation rates of the annular-groove rotating disk 1 via the magnetic block moving digital signals marked with the positions and orders of the magnetic blocks and inputted by the analog-to-digital converting and wave peak recognizing device 22, and converts rotation rate digital signals of the annular-groove rotating disk 1 to the power assistance starting point selector 23, the power assistance starting point selector 23 determines a certain rectangular wave corresponding to one power assistance starting point under a certain rotation rate condition via the magnetic block moving digital signal marked with the positions and orders of the magnetic blocks and the rotation rate digital signal of the annular-groove rotating disk 1, namely, determines a power assistance staring point magnetic block;

both the power assistance starting point selector 23 and the magnetic block rotation rate calculator 24 are connected with the power assistance model calculator 26, the power assistance model storage 25 is also connected with the power assistance model calculator 26; the power assistance model calculator 26 selects a certain power assistance model function of the power assistance model storage 25 via the power assistance starting point magnetic block determined by the power assistance starting selector 23 and the rotation rate of the annular-groove rotating disk 1 calculated by the magnetic block rotation rate calculator 24, the power assistance starting point magnetic block and the rotation rate of the annular-groove rotating disk 1 are inputted into the power assistance model function to calculate a power assistance model digital signal under these two conditions, that is to say, that the power assistance model calculator 26 outputs the power assistance model digital signals;

[3] the digital-to-analog converter 27 is adapted for converting the power assistance model digital signals to power assistance model analog signals;

wherein the power assistance model calculator 26 is connected with the digital-to-analog converter 27, and the digital-to-analog converter 27 converts the power assistance model digital signals of the power assistance model calculator 26 to the power assistance model analog signals;

[4] the operational amplifier 28 is adapted for converting the power assistance model analog signals of the digital-to-analog converter 27 to power assistance model analog signals within a rated voltage range.

[I] Description of the sensing element:

The annular-groove rotating disk 1 is not only engaged with the annular-groove fixing disk 40, but also capable of relatively rotating with each other, which ensures when the annular-groove rotating disk 1 rotates, induction positions of the Hall element 3 relative to all of the permanent magnetic blocks 2 are not changed, such that output signals of the Hall element 3 are only related to a rotation of all of the permanent magnetic blocks 2, and not related to the annular-groove rotating disk 1 and the annular-groove fixing disk 40; if the annular-groove rotating disk 1 and the annular-groove fixing disk 40 are made of metal, a shielding effect will be produced, so that the Hall element 3 and all of the permanent magnetic blocks 2 are located within the hollow ring 41 via the annular-groove rotating disk 1 and the annular-groove fixing disk 40 for inducting, which improves the signal reliability and authenticity of the Hall element 3.

When the annular-groove fixing disk 40 is fixed to a certain object, the annular-groove rotating disk 1 is rotated, and each of the permanent magnetic blocks 2 on the annular-groove rotating disk 1 sweeps the Hall element 3 on the annular-groove fixing disk 4, the Hall element 3 is capable of generating an electrical signal via each of the permanent magnetic blocks 2. The magnetic polarities of two adjacent permanent magnetic blocks 2 are opposite, that is to say, that the magnetic polarities of all of the permanent magnetic blocks 2 face to the Hall element 3 in a pattern of south-north alternation, so that the Hall element 3 generates the rectangular wave signals which are convenient for digitalization to achieve the digital control. In the prior art, the magnetic polarities of all of the permanent magnetic blocks 2 facing to the Hall element 3 are same, so that the Hall element 3 only generates sine wave signals for analog control; once inductive parameters of the Hall element 3 change, the analog control may be distorted. However, the present invention adopts the rectangular wave signals to digitally control, so that the digital distortion is not generated.

The annular-groove rotating disk 1 can be a not-easily deformed material plate made of plastic, high-strength insulation material, copper and aluminum. While using the sensing element, the annular-groove rotating disk 1 needs to be rotated, a rotation center is a center of a circle at which an annular distribution, formed by the permanent magnetic blocks 2, is provided.

An object of the annular distribution of the permanent magnetic blocks 2 is to only adopt one Hall element 3 to induct the moving states of all of the permanent magnetic blocks 2 on the annular-groove rotating disk, that is to say, to induct moving positions and velocities of all permanent magnetic blocks 2 on the annular-groove rotating disk and speed variations thereof, namely, or called accelerations, the moving states of all of the permanent magnetic blocks 2 are expressed via a continuously electrical signal generated by the Hall element 3. And because all of the permanent magnetic blocks 2 are respectively fixed on the annular-groove rotating disk 1, the continuously electrical signal generated by the Hall element 3 is capable of express a moving state of the annular-groove rotating disk. If the continuously electrical signal is used to control other objects, the continuously electrical signal is a control signal. If a motor for controlling a power assistance bicycle also needs a SCM (Single Chip Microcomputer) or other electronic components as a signal processor, the essential factor comprising the position, velocity and acceleration in the control signal is converted to the power assistance signals which represent how much power assistance is needed, a conversion function is a power assistance demand model, or called a power assistance model.

The meaning of different magnetic fluxes of the permanent magnetic blocks 2 is as below. The electrical signals generated by the Hall element 3 are not the same pulse signals, but the pulse signals with different peak-valley differences, different positions of different permanent magnetic blocks are distinguished by the different pulse signals for obtaining the moving states of the permanent magnetic blocks 2 at different positions to accurately express a moving state of a certain position of the annular-groove rotating disk or a moving state of each of the permanent magnetic blocks 2. If the permanent magnetic blocks 2 with different magnetic fluxes are applied to the power assistance bicycle, the demands of the pedals at different positions for the power assistance can be accurately expressed to more accurately express the power assistance demand, so that the bicycle is more consistently coordinated with the rider.

The different magnetic fluxes of the permanent magnetic blocks 2 mean that the magnetic fluxes of the permanent magnetic blocks 2 are changed, a changed range thereof should be a magnetic flux range which is capable of being inducted by the same Hall element 3 with an unchanged position, that is to say, that a highest value and a lowest value of the magnetic fluxes of the permanent magnetic blocks 2 is in a magnetic flux range which is capable of being inducted by the Hall element 3.

The Hall element 3 is located at a position which is close to the permanent magnetic blocks 2 and capable of inducting the magnetic fluxes of the permanent magnetic blocks 2 to induct the moving states of the permanent magnetic blocks 2 via the Hall element 3, namely, the moving positions, velocities and accelerations.

It is very important for every two adjacent permanent magnetic blocks 2 to have opposite magnetic polarities, the magnetic polarities of all of the permanent magnetic blocks 2 are distributed in a pattern of pole N, pole S, pole N, pole S, pole N, pole S . . . to output the rectangular wave signals with spaced high and low levels via the Hall element 3. When the annular-groove rotating disk with limited size is rotated for a circle, the accurately variable signals are needed to be acquired as many as possible, so that the rectangular wave is selected. The variable time of the peak-valley value of the rectangular wave signal is short, so the signals adapted for controlling as many as possible are generated within a certain time. The structure that every two adjacent permanent magnetic blocks 2 having opposite magnetic polarities produces the rectangular waves, and however, the structure that every two adjacent permanent magnetic blocks 2 having same magnetic polarities produces the sine waves, especially for the power assistance bicycle, a diameter of the annular-groove rotating disk as the sensing element is generally limited to 10-15 cm, when the signals adapted for controlling are acquired under the condition of the limited diameter, rotating a circle, the pulses capable of being provided of producing the rectangular waves is 7 to 9 times the number of producing the sine waves. Naturally, the structure that every two adjacent permanent magnetic blocks 2 having opposite magnetic polarities has a better control effect on the power assistance bicycle, the rider is capable of better coordinating with the bicycle, and the rider feels more comfortable while riding the bicycle.

[II] The description of the power assistance model processor 21: the power assistance model processor 21 is a signal form converter adapted for converting the rotating digital signals of the annular-groove rotating disk 1 to the power assistance model digital signals;

wherein the power assistance model processor 21 comprises an analog-to-digital converting and wave peak recognizing device 22, a power assistance starting point selector 23, a magnetic block rotation rate calculator 24, a power assistance model storage 25 and a power assistance model calculator 26; the processing idea of these components to the signals is as below: the rectangular wave signal of the Hall element 3 in the sensing element are decomposed to acquire a position digital signal which represents a position of each of the permanent magnetic blocks 2 and a velocity digital signal which represents a rotation rate of the annular-groove rotating disk 1, due to the position and velocity are digital signals, the position and velocity are capable of being processed via a power assistance mathematical model which is designed based on the people's best feeling, such that the power assistance model digital signal outputted by the power assistance model processor 21 has not only the best power assistance mathematical model, but a starting point and an end point of the power assistance mathematical model. Due to the position digital signal of each of the permanent magnetic blocks 2, the starting point and the end point are accurate for fully synchronizing with the people's power assistance demand Therefore, the present invention resolves the problems that the people's power assistance demand and the power assistance model do not match without the position signals of the permanent magnetic blocks 2 in the prior art, an operation of the power assistance model delays the power assistance demand, and the people and the machine do not match in the prior art, such as no force is provided while applying a force, a small force is provided while applying a big force, a big force is provided while applying a small force, a force is provided while no force is needed. The connection relationship and function of every component in the power assistance model processor 21 are as follows.

The analog-to-digital converting and wave peak recognizing device 22 connected with the sensing element recognizes a wave peak of every rectangular wave inputted by the Hall element 3 of the sensing element, converts each of the rectangular signal to various digital signals, marks every rectangular wave, and outputs the rectangular signals marked with the positions and orders of the magnetic blocks. Thus, the rectangular signals whose waveforms have different peak values are converted to the rectangular signals marked with data, which is convenient for converting the peak values of the rectangular waves to the position data thereof for operating during the following digitalization. Therefore, the analog-to-digital converting and wave peak recognizing device 22 is a processor adapted for converting a signal which uses the peak value of the rectangular wave to represent the position of each of the magnetic blocks to a digital signal which uses the data to mark the position of each of the magnetic blocks, which is an important inventive point of the present invention compared with the existing power assistance bicycle. With the digital signal using the data to mark the position of each of the magnetic blocks, the present invention is capable of finding a position of a certain or every magnetic block on the cyclically circularly moving annular-groove rotating disk 1 to generate, increase, reduce and stop a power resistance for starting the motor 30, so as to match the people's power assistance demand with the power assistance behavior of the motor 30, thereby avoiding the problems that the existing power assistance bicycle is difficult to achieve the coordination of the rider with the bicycle, the motor can't be rotated while needing the power assistance, the motor maintains the rotation and can't be stopped while no power assistance is needed, even the collision accident is caused.

The analog-to-digital converting and wave peak recognizing device 22 is connected with the power assistance starting point selector 23 and the magnetic block rotation rate calculator 24, the power assistance starting point selector 23 is connected with the magnetic block rotation rate calculator 24; the magnetic block rotation rate calculator 24 calculates a rotation rate of the annular-groove rotating disk 1 via the magnetic block moving digital signals which are marked with the positions and orders of the magnetic blocks and are inputted by the analog-to-digital converting and wave peak recognizing device 22, and converts rotation rate signals of the annular-groove rotating disk 1 to the power assistance starting point selector 23, the power assistance starting point selector 23 determines a certain rectangular wave corresponding to one power assistance starting point under a certain rotation rate condition via the magnetic block moving digital signal marked with the positions and orders of the magnetic blocks and the rotation rate signal of the annular-groove rotating disk 1, namely, determines a power assistance staring point magnetic block. The determined power assistance staring point magnetic block is the rectangular wave marked with data, so the power assistance staring point magnetic block has the position of an only corresponding magnetic block, such that, when the power assistance starting point selector 23 finds the position of the power assistance staring point magnetic block 2, a position of the certain magnetic block 2 is also determined, the motor is started or ended to have a certain power assistance model motion. As a result, the people controls the special magnetic block 2 on the annular-groove rotating disk 1 to synchronously move, and the special magnetic block 2 controls the motor to specially synchronously rotate for achieving the people synchronous controlling the motor. No inaccurately controlled starting point and ending point occur, and no delay of the controlled starting point and ending point occur. However, when the existing power assistance bicycle starts and ends the power assistance, the starting and ending positions synchronized with the people are not capable of being found, thereby causing the delay of the controlled starting point and ending point.

Both the power assistance starting point selector 23 and the magnetic block rotation rate calculator 24 are connected with the power assistance model calculator 26, the power assistance model storage 25 is also connected with the power assistance model calculator 26; the power assistance model calculator 26 selects a certain power assistance model function of the power assistance model storage 25 via the power assistance starting point magnetic block determined by the power assistance starting selector 23 and the rotation rate of the annular-groove rotating disk 1 calculated by the magnetic block rotation rate calculator 24, the power assistance starting point magnetic block and the rotation rate of the annular-groove rotating disk 1 are inputted into the power assistance model function to calculate a power assistance model digital signal under these two conditions, that is to say, that the power assistance model calculator 26 outputs the power assistance model digital signals.

[III] The description of the digital-to-analog converter 27: the digital-to-analog converter 27 is adapted for converting the power assistance model digital signals to the power assistance model analog signals.

The power assistance model calculator 26 is connected with the digital-to-analog converter 27, and the digital-to-analog converter 27 converts the power assistance model digital signals of the power assistance model calculator 26 to the power assistance model analog signals for outputting the power assistance model analog signals to a motor controller 29 which is only capable of processing the analog signals.

[IV] The description of the operational amplifier 28: the operational amplifier 28 is adapted for converting the power assistance model analog signals of the digital-to-analog converter 27 to the power assistance model analog signals within the rated voltage range.

The digital-to-analog converter 27 is connected with the operational amplifier 28, the power assistance model analog signals of the digital-to-analog converter 27 resolve the power assistance model problem, but the voltage of the power assistance model signal still can not meet the demand of the motor controller 29. Therefore, the power assistance model analog signals are converted to the power assistance model analog signals needed by the rated voltage range via the operational amplifier 28, and then are transmitted to the motor controller 29.

According to the present invention, signals outputted by the signal processing elements are:

the Hall element 3 outputs rectangular wave signals;

the power assistance model processor 21 outputs power assistance model digital signals;

the analog-to-digital converting and wave peak recognizing device 22 outputs magnetic block moving digital signals marked with positions and orders of the permanent magnetic blocks;

the power assistance starting point selector 23 outputs starting point position signals of determined power assistance starting point magnetic blocks;

the magnetic block rotation rate calculator 24 calculates and outputs rotation rate digital signals of the annular-groove rotating disk 1;

the power assistance model storage 25 stores a plurality of power assistance model functions for alternating, and outputs digital signals of the selected power assistance model function;

the power assistance model calculator 26 calculates and outputs power assistance model digital signals for controlling functions;

the digital-to-analog converter 27 outputs power assistance model analog signals converted from the power assistance model digital signals;

the operational amplifier 28 outputs power assistance model analog signals within a rated voltage range converted from the power assistance model analog signals; and a thermal resistor R6 ensures that the operational amplifier 28 outputs the power assistance model analog signals within the rated voltage range, namely standard power assistance model analog signals.

For solving drift of the power assistance model analog signals, the thermal resistor R6 is provided. The thermal resistor R6 is connected between an input terminal and an output terminal of the operational amplifier 28.

The Hall element 3, the digital-to-analog converter 27 and the operational amplifier 28 are semiconductor devices with analog signal processing capability. Therefore, signals are easy to drift due to temperature changes, especially in summer and winter. Furthermore, the power assistance bicycle is utilized outdoor, and signal parameter drift due to temperature changes is significant. As a result, the signals outputted by the operational amplifier 28 should be drift-revised for obtaining the standard power assistance analog signals which are not affected by the temperature changes. The standard power assistance analog signals control the motor 30 through the motor controller 29, in such a manner that a rider feels no difference between power assistance effects in summer and winter.

The power assistance model processor 21 is a single chip microcomputer 31, and a clock circuit 32 is connected to the single chip microcomputer 31. The single chip microcomputer 31 completes functions of the analog-to-digital converting and wave peak (mine) recognizing device 22, the power assistance starting point selector 23, the magnetic block rotation rate calculator 24, the power assistance model storage 25, and the power assistance model calculator 26. Clock signals of the clock circuit 32 are for distinguishing the rectangular wave signals inputted from the Hall element 3, preferably, a length of each clock signal is 0.001 s.

A structure of mechanical parts and sensing parts of the sensor is: the mechanical parts of the sensor are the annular-groove rotating disk 1 and the annular-groove fixing disk 40 engaged with each other; the sensing parts of the sensor are a plurality of permanent magnetic blocks 2, the Hall element 3, the single chip microcomputer 31, the digital-to-analog converter 27, and the operational amplifier 28; wherein among the sensing parts, the Hall element 3, the single chip microcomputer 31, the digital-to-analog converter 27, and the operational amplifier 28, which are connected in sequence, are provided on a circuit board 59; a plurality of permanent magnetic blocks 2 are provided on an internal wall of the annular-groove rotating disk 1 of the hollow ring 41, and the circuit board 59 is mounted on an internal wall of the annular-groove fixing disk 40 of the hollow ring 41; the Hall element 3 on the circuit board 59 is provided at a position where the Hall element 3 senses magnetic fluxes of the permanent magnetic blocks 2 and outputs electrical signals according to magnetic flux changes. The sensing parts are sensing functional parts of the sensor. The mechanical parts have two functions: firstly, keeping relative positions of the elements of the sensing parts for forming a sensing functional integral with the elements; secondly, mounting the sensing functional integral on an electric bicycle and enabling the sensing functional integral to sense a moving state of the electric bicycle. Providing the Hall elements 3, the single chip microcomputer 31, the digital-to-analog converter 27, and the operational amplifier 28, which are connected in sequence, on the circuit board 59 is conducive to integration, modularization and miniaturization thereof, as well as mounting the four elements on the internal wall of the annular-groove fixing disk 40 of the hollow ring 41 as a whole, for simplifying manufacturing of the sensor.

According to the present invention, preferred models and connection of each part of the sensor are: the Hall element 3 is UGN3075, the power assistance model processor 21 is the AT89S52 single chip microcomputer 31, the digital-to-analog converter 27 is ADC-C8E, the operational amplifier 28 is OF-17F, the thermal resistor R6 is connected between an input pin 2 and an output pin 6 of the OF-17F operational amplifier 28; wherein the connection relationship thereof are as follows:

an output pin 3 of the Hall element 3 is connected to a pin 12, namely INTO [P32], of the single chip microcomputer 31;

a pin 39, namely P00, of the single chip microcomputer 31 is connected to a pin 12, namely B8, of the digital-to-analog converter 27;

a pin 38, namely P01, of the single chip microcomputer 31 is connected to a pin 11, namely B7, of the digital-to-analog converter 27;

a pin 37, namely P02, of the single chip microcomputer 31 is connected to a pin 10, namely B6, of the digital-to-analog converter 27;

a pin 36, namely P03, of the single chip microcomputer 31 is connected to a pin 9, namely B5, of the digital-to-analog converter 27;

a pin 35, namely P04, of the single chip microcomputer 31 is connected to a pin 8, namely B4, of the digital-to-analog converter 27;

a pin 34, namely P05, of the single chip microcomputer 31 is connected to a pin 7, namely B3, of the digital-to-analog converter 27;

a pin 33, namely P06, of the single chip microcomputer 31 is connected to a pin 6, namely B2, of the digital-to-analog converter 27;

a pin 32, namely P07, of the single chip microcomputer 31 is connected to a pin 5, namely B1, of the digital-to-analog converter 27;

a pin 4 of the digital-to-analog converter 27 is connected to the pin 2 of the operational amplifier 28;

a pin 2 of the digital-to-analog converter 27 is connected to a pin 3 of the operational amplifier 28; and the pin 6 of the operational amplifier 28 is an analog signal output terminal.

The thermal resistor R6 is connected between the input pin 2 and the output pin 6 of the OF-17F operational amplifier 28, and a capacitor C6 is connected to two ends of the thermal resistor R6 in parallel. Preferably, a resistance of the thermal resistor R6 is 5K, a capacitance of the capacitor C6 is 8P, and a resistor R5 with a resistance of 1.25 k is connected between the pin 4 of the digital-to-analog converter 27 and the pin 2 of the operational amplifier 28 for grounding, in such a manner that a voltage range of the analog signals outputted by the pin 6 of the operational amplifier 28 is capable of being adjusted by the thermal resistor R6 to 0.8~4.2V.

A bearing 42 is provided between an external surface of an internal ring of the annular-groove fixing disk 40 and an internal surface of an internal ring of the annular-groove rotating disk 1. The bearing 42 keeps a sufficient relative rotation between the annular-groove fixing disk 40 and the annular-groove rotating disk 1 for a long time.

The Hall element 3 is provided between the internal circular trajectory and the external circular trajectory, because the Hall element 3 is able to sense the magnetic fluxes of the permanent magnetic blocks 2 and output the electrical signals with an interval. Furthermore, for decreasing a volume of the permanent magnetic blocks 2 as much as possible, providing the permanent magnetic blocks 2 on the annular-groove rotating disk 1 as many as possible, and sensing all the permanent magnetic blocks 2 by the Hall element 3, the Hall element 3 is provided between the internal circular trajectory and the external circular trajectory, and preferably at a position which crosses all circular trajectories of the permanent magnetic blocks 2.

A center hole is drilled at a center of a circular range of the internal circular trajectory of the permanent magnetic blocks 2 on the annular-groove rotating disk 1. If the annular-groove rotating disk 1 is coated on a rotation shaft for being utilized, a coating hole for the rotation shaft should be drilled on the annular-groove rotating disk 1. For enabling the Hall element 3 to sense the moving signals of all of the permanent magnetic blocks 2 on the annular-groove rotating disk 1 when the annular-groove rotating disk 1 rotates with the rotation shaft, the coating hole on the annular-groove rotating disk 1 should be drilled at the center of the circular range of the internal circular trajectory of the permanent magnetic blocks 2. Because the external circular trajectory is a concentric circle of the internal circular trajectory, the coating hole is of course at a center of a circular range of the external circular trajectory. The coating hole is a center position hole of the internal circular trajectory and the external circular trajectory, namely a center hole. However, the center hole does not have to be circular, the center hole may be square, triangle, etc., so as to cooperate with a square, triangle or other shape rotation shaft, but a hollow area of the center hole must include a circle center of the internal circular trajectory, in such a manner that one Hall element 3 is able to sense the moving signals of all of the permanent magnetic blocks 2 on the annular-groove rotating disk 1.

At least a magnetic flux of one permanent magnetic block 2 is different from that of all other permanent magnetic blocks 2. By being different, the special magnetic flux may represent a position of a pedal of a bicycle. Preferably, the magnetic fluxes of at least two permanent magnetic blocks 2 are different from that of all other permanent magnetic blocks 2, the two special permanent magnetic blocks 2 with special magnetic fluxes respectively correspond to two pedals of the bicycle for representing positions of the two pedals. Because the pedals move circularly, determining the positions thereof is very important for obtaining a speed of the circular movement and determining a power assistance model for next circular movement.

The annular-groove rotating disk 1 is made of a non-magnetic plastic, aluminum or copper board. According to the present invention, the adjacent permanent magnetic blocks 2 have opposite magnetic polarities, which enable the Hall element 3 to output the electrical signals with a controlling function even if edges of the adjacent permanent magnetic blocks 2 are almost contacted with each other.

Advantages of the present invention are: a simple structure, a low cost, no quantity limit for the permanent magnetic blocks on a permanent magnetic block ring, outputting standard pulse signals, no signal blind area, fully representing all moving states of a moving disk only by a set of output signals of one Hall element, no distortion and drift of the output signals, representing a certain position by magnetic flux changes of the permanent magnetic blocks, outputting signals which may comprise movement positions of all permanent magnetic blocks, being adaptable for power assistance bicycles, and comforting a rider by highly cooperating power assistance output with power assistance requirements.

(1) the simple structure, no elastic member, no mechanical failure: the Hall element senses the rotating output signals of a plurality of permanent magnetic blocks; with a speed-to-moment principle provided by a Chinese patent 01201843.0, moment parameters of the power assistance bicycle are able to be calculated by a variety of mathematical models, so as to control the motor of the power assistance bicycle for power assistance; no elastic part is utilized, the structure is simple, and the cost of the present invention is lower than that of sensors using the elastic parts and mechanical force bearing; deformation of each mechanical part after long-term use is avoided, no mechanical failure and cooperating problem exist.

(2) the opposite magnetic polarities, outputting the rectangular wave signals, and the precise controlling function: because the adjacent permanent magnetic blocks have opposite magnetic polarities and the Hall element generating rectangular wave output signals according to the opposite polarities is utilized, no matter how narrow an interval is between the adjacent permanent magnetic blocks, even if there is no gap, the Hall element is also able to output rectangular wave signals; if the sensor is utilized on the power assistance bicycle, the rectangular wave output signals are better than sine waves for controlling the power assistance bicycle, because by utilizing rectangular waves, signals representing moving positions and speeds are precise at any point and any time, so as to precisely represent moving positions and speed of pedals of the power assistance bicycle, for calculating correct power assistance requirements for the moving state by a precise position and speed of the pedals.

(3) the opposite magnetic polarities of the adjacent permanent magnetic blocks, no quantity limit for the permanent magnetic blocks, and increase sensing points as many as possible: because of the opposite magnetic polarities and the rectangular wave output signals, even if there is no gap between the adjacent permanent magnetic blocks, the output signals are still a plurality of distinguishable rectangular wave signals with the controlling function; that is to say, linear signals with no controlling function and no change will not be outputted; if the sensor is utilized on the power assistance bicycle, a size of the annular-groove rotating disk linked with the pedals is limited, and the permanent magnetic blocks and the sensing points are arranged as many as possible, in such a manner that the moving positions and speeds of the pedals are represented by as many sensing signals as possible for precise representation of the moving state.

(4) the opposite magnetic polarities of the adjacent permanent magnetic blocks, a large number of the permanent magnetic blocks and the sensing points, and the precise representation of the moving state of the annular-groove rotating disk: the size of the annular-groove rotating disk adapting to the power assistance bicycle for fixing the permanent magnetic blocks is strictly limited; usually a diameter thereof is no more than 10~15 cm; for enabling the Hall elements to sense polarity signals of the permanent magnetic blocks with the intervals, a diameter of each of the permanent magnetic blocks is at least 0.6~0.8 cm, and 35~73 permanent magnetic blocks are able to be arranged without interval around the annular-groove rotating disk with the diameter of 10~15 cm, wherein [(10−1)*3.14/0.8=35; (15−1)*3.14/0.6=73]; that is to say, after the pedal rotates once, the Hall element is able to obtain 35-73 signals for controlling the motor of the power assistance bicycle; however, according to the conventional technology where magnetic polarities of adjacent permanent magnetic blocks are the same, the adjacent permanent magnetic blocks having a 5 cm-interval; as a result, only 5~8 permanent magnetic blocks are able to be arranged around the annular-groove rotating disk with a diameter of 10~15 cm, wherein [(10−1)*3.14/5.8=5; (15−1)*3.14/5.6=8]; therefore, the permanent magnetic blocks of the present invention are 7~9 times more than the permanent magnetic blocks of the conventional technology, wherein [35/5=6; 73/8=9]; which means 30~65 more permanent magnetic blocks are provided, wherein [35−5=30; 73−8=65]; therefore, after the annular-groove rotating disk rotates once, rotating point signals of the annular-groove rotating disk of the present invention is 7~9 times more than that of the conventional technology; as a result, motor control accuracy for a power assistance bicycle is naturally raised by 7~9 times and power assistance accuracy for the rider is also increased by 7~9 times, in such a manner that cooperation of the rider and the bicycle are greatly improved as well as rider comfort; uncomfortable feeling according to the conventional technology, which is sometimes fast and sometimes slow, no longer exists; according to actual experience of the applicant, when there are about 15 permanent magnetic blocks evenly provided on the annular-groove rotating disc, the feeling which is sometimes fast and sometimes slow due to 5~8 permanent magnetic blocks of the conventional technology is basically eliminated; when there are about 20 permanent magnetic blocks evenly provided on the annular-groove rotating disc, the cooperation of the bicycle and the rider is able to satisfy the rider and the power assistance bicycle comfortable to ride.

(5) no signal blind area, providing power assistance corresponding the power assistance requirements at any time: according to the present invention, at most 35~73 permanent magnetic blocks are able to be arranged around the annular-groove rotating disk with the diameter of 10~15 cm, and an average angle between the adjacent permanent magnetic blocks are 5~10 degrees; if the sensor is utilized on the power assistance bicycle, during starting or running, there are 4~7 permanent magnetic blocks in a 35-degree area determined by the pedal from 10 to 45 degrees away from an apex (at 10 degrees away from the apex there is a first signal), and the Hall element outputs 4~7 controlling signals representing the power assistance requirements for achieving a excellent technical effect that the power assistance is available at anywhere and anytime as long as there is the power assistance requirement, in such a manner that the cooperation of the bicycle and the rider is sufficient and rider feels comfortable.

(6) only one Hall element, one controlling signal representing all moving states of the annular-groove rotating disk, the controlling signal completely consistent with the moving state of annular-groove rotating disk, and the controlling signal completely consistent with rider requirements: a plurality of permanent magnetic blocks are mounted on the annular-groove rotating disk and synchronously rotate with the annular-groove rotating disk; by sensing the moving signals of all of the permanent magnetic blocks by one Hall element, the controlling signals outputted by the Hall element is completely consistent with the moving state of the annular-groove rotating disk as well as the rider requirements, and the controlling signals avoids initial segment errors and signal drift; Even if sensing parameters of the Hall element change, the controlling signals will move in parallel; as long as a receiving range of the motor receiving the Hall controlling signals is wide, a controlling effect of the changed controlling signals will systemically change, if the sensor is utilized on the power assistance bicycle, a power assistance requirement model will not be distorted, power assistance output and the power assistance requirements remain an original model matching relationship, wherein the rider can easily handle the systemic change of power assistance performance.

(7) the permanent magnetic blocks having changed magnetic fluxes, which may represents moving states of certain positions: due to the changed magnetic fluxes of the permanent magnetic blocks, the Hall element outputs controlling signals with certain peak-valley value differences, in such a manner that the controlling signals with the certain peak-valley value differences are able to directly represent the moving states of a certain permanent magnetic block position of the annular-groove rotating disk; if each of the permanent magnetic blocks has a particular magnetic flux, particular position moving state signals may be as many as the permanent magnetic blocks; if the sensor is utilized on the power assistance bicycle and the diameter of the annular-groove rotating disk is 10~15 cm, after the annular-groove rotating disk rotates once, moving state controlling signals of 35~73 positions are obtained by the Hall element, in such a manner that the power assistance requirements of 35~73 positions are of course obtained; it is well known that after the annular-groove rotating disk rotates once, at most 5~8 power assistance requirements are able to be obtained by the conventional technology, which is far less than the maximum 35~73 power assistance requirements according to the present invention for representing the power assistance requirements of the rider in a more realistic and multi-information way; in other words, with the present invention, the power assistance bicycle completely satisfies the rider requirements, and the rider feels that a speeding is completely controllable no matter where the pedals are as well as comfort is good; according to a conventional power assistance bicycle, the speed is only controllable at no more than 5~8 rotating positions.

(8) a housing is formed by the relative-rotating annular-groove rotating disk and the annular-groove fixing disk, which fixes relative positions of the Hall element and all of the permanent magnetic blocks for avoiding external environment interference, improving reliability and authenticity of the Hall signals, and facilitating installation, commissioning as well as maintenance.

(9) digitization for the Hall signals, which adds a preferred man-machine control model to the controlling signals: the rectangular wave signal having magnetic block positions and magnetic block rotation rates is respectively transformed into a digital signal of the magnetic block positions and a digital signal of the magnetic block rotation rates; the digital signal of the magnetic block positions and the digital signal of the magnetic block rotation rates are transformed into the power assistance model digital signals by a mathematical power assistance model which is given and suitable for the man-machine cooperation, then the power assistance model digital signals are transformed into the power assistance model analog signals, and finally the power assistance model analog signals are transformed into the controlling signals suitable for the motor controller with a stable voltage range and rated power; in short, the magnetic block rotation signals digitalized, and during the digitalization, the mathematical power assistance model is added, in such a manner that the power assistance model is comprised in the final controlling signals outputted by the sensor; because the mathematical power assistance model is artificial, the mathematical power assistance model is always able to be set to the preferred man-machine model, in such a manner that the sensor according to the present invention is able to output preferred man-machine controlling signals; however, according to the conventional sensor for the power assistance bicycle, same polarities of different permanent magnetic blocks are at the same side; therefore, the Hall element cannot obtain the rectangular wave signals, and the Hall signal cannot be digitized, wherein a control model of the conventional sensor is only able to partly modify the Hall signals, which cannot output the preferred man-machine controlling signals.

(10) no signal drift for the last controlling signals: the thermal resistor R6 provides feedback regulation for the output signals of the operational amplifier, which is able to the solve an analog signal drift problem of the power assistance model due to semiconductor devices such as the Hall element, the digital-to-analog converter and the operational amplifier, in such a manner that the sensor finally outputs the standard power assistance model analog signals which are not affected by the environment temperature changes.

Element reference: 1—annular-groove rotating disk, 2—permanent magnetic block, 3—Hall element, 5—circular trajectory, 21—power assistance model processor, 22—analog-to-digital converting and wave peak recognizing device, 23—power assistance starting point selector, 24—magnetic block rotation rate calculator, 25—power assistance model storage, 26—power assistance model calculator, 27—digital-to-analog converter, 28—operational amplifier, 29—motor controller, 30—motor, 31—single chip microcomputer, 32—clock circuit, 40—annular-groove fixing disk, 41—hollow ring, 42—bearing, 59—circuit board.

DETAILED DESCRIPTION OF THE PREFERRED EMBODIMENT

Example 1

Figure 1:
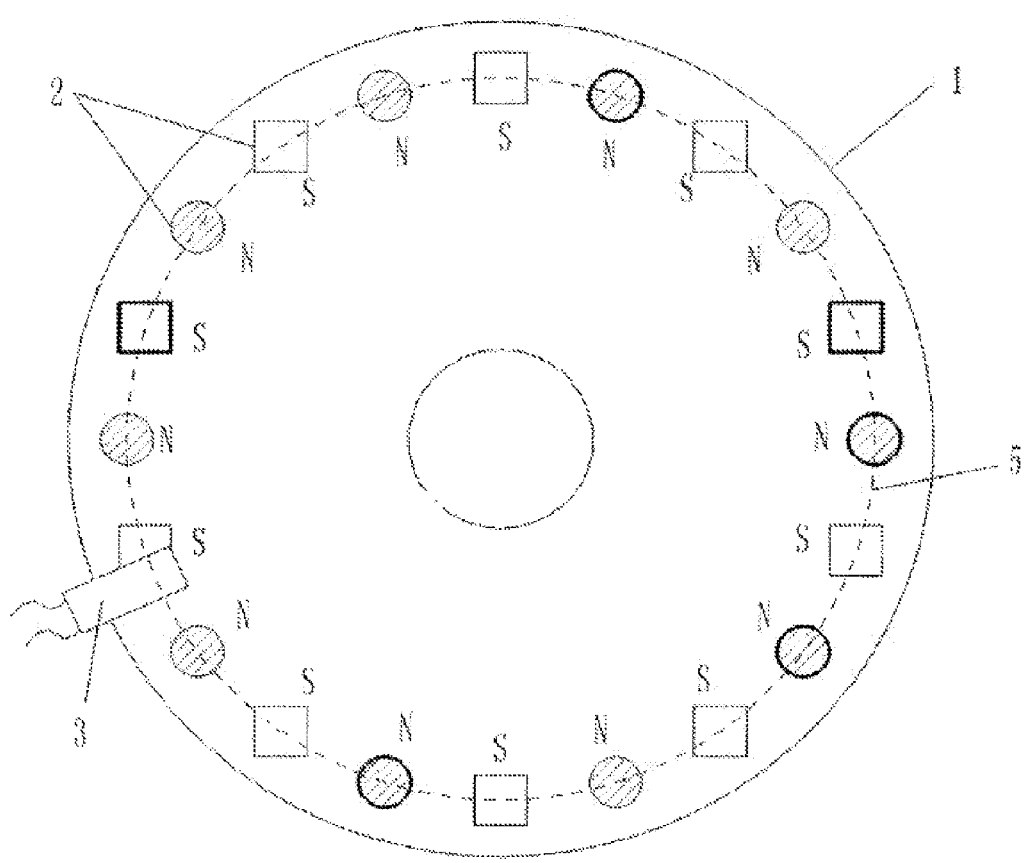
FIG. 1 is a structurally schematic view of a sensing element comprising a plurality of N-S alternating permanent magnetic blocks which are not evenly distributed on an annular-groove rotating disk.
Figure 3:
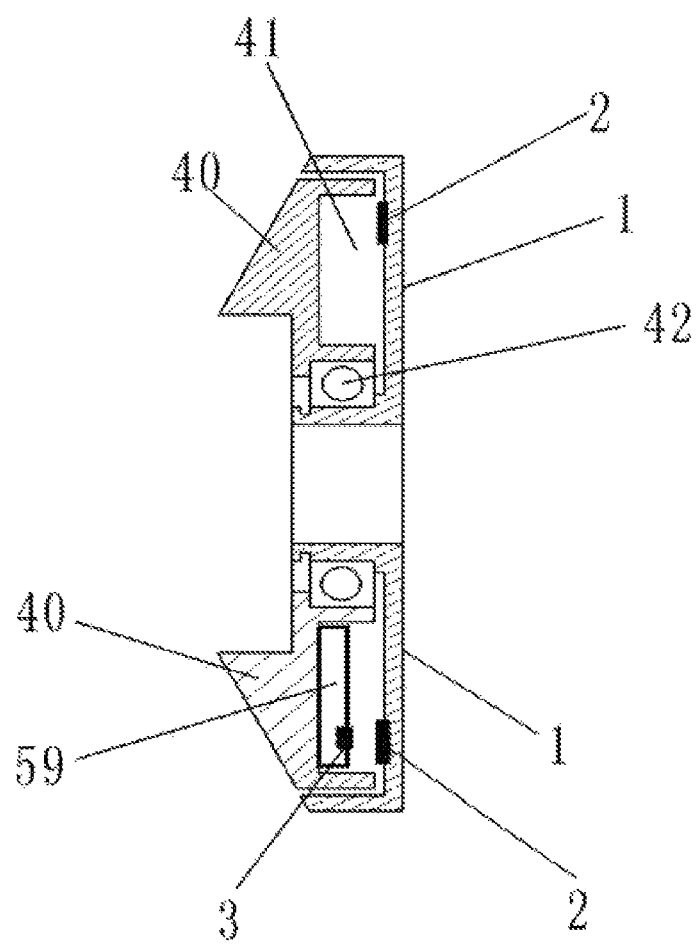
FIG. 3 is a sectional view of a sensor.
Figure 4:
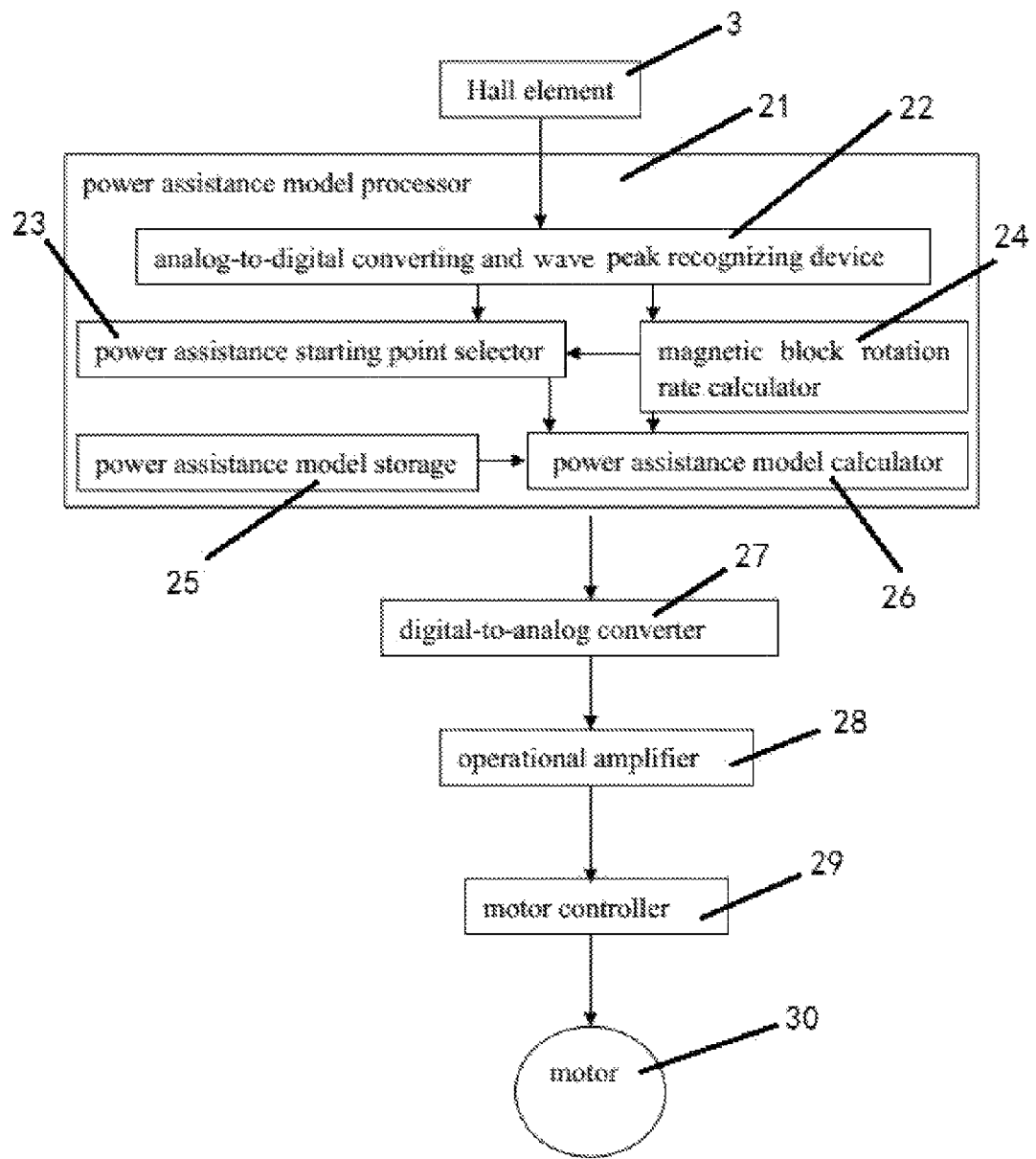
FIG. 4 is block diagram of signal flow of a Hall element, a power assistance model processor, a digital-to-analog converter and an operational amplifier.

A Sensor Having Multiple Magnetic Blocks of Unevenly Distributed Magnetic Fluxes in a Housing Referring to FIGS. 1, 3 and 4 of the drawings, the sensor according to this embodiment comprises a sensing element, a power assistance model processor 21, a digital-to-analog converter 27, and an operational amplifier 28 connected in sequence.

[1] The sensing element is adapted for transforming rotational motions of an annular-groove rotating disk 1 to rectangular wave output signals;

a concave of the annular-groove rotating disk 1 is opposite to that of the annular-groove fixing disk 40, the annular-groove rotating disk 1 and the annular-groove fixing disk 40 have a certain size such that the annular-groove fixing disk 40 is engaged with an annular groove of the annular-groove rotating disk 1 to form a fitting interior-empty housing in which two disks are capable of relatively rotating with each other, the concave of the annular-groove rotating disk 1 and that of the annular-groove fixing disk 40 form a hollow ring 41; twenty permanent magnetic blocks 2 are fixedly arranged on a portion of the annular-groove rotating disk 1 within the hollow ring 41. The annular-groove rotating disk 1 and the annular-groove fixing disk 40 are made of plastic with high strength for injection molding.

A surface diameter of the annular-groove rotating disk 1 within the hollow ring 41 is 10.0 cm. Twenty permanent magnetic blocks 2, each of which has a diameter of 0.8 cm and a magnetic flux selected from a range of 146-279 (B·H)max/KJ·m$^{-3}$, are arranged on the annular-groove rotating disk 1, and the magnetic fluxes of adjacent permanent magnetic blocks 2 are different. The structures of the annular-groove rotating disk 1, the permanent magnetic blocks 2 and the Hall element 3 are as follows.

All of the permanent magnetic blocks 2 are evenly distributed along a circular trajectory, each of the permanent magnetic blocks 2 is fixed on the circular trajectory 5 with a diameter of 9.0 cm, that is to say, that a distance between each of the permanent magnetic blocks 2 and a circle center of the circular trajectory 5 is same, and a distance between every two adjacent permanent magnetic blocks 2 is same.

The magnetic fluxes of two permanent magnetic blocks 2 are not same as that of any other permanent magnetic blocks 2, the magnetic fluxes of the two permanent magnetic blocks 2 are also different, the two permanent magnetic blocks 2 are located at two ends of one diameter of the annular-groove rotating disk 1 for representing moving positions of two pedals on the power assistance bicycle.

The magnetic polarities of every two adjacent permanent magnetic blocks 2 on one surface of the annular-groove rotating disk 1 are opposite, that is to say, that the magnetic polarities of all of the permanent magnetic blocks 2 on one surface of the annular-groove rotating disk 1 are distributed in a pattern of pole N, pole S, pole N, pole S, pole N, pole S . . . .

A Hall element 3 is fixedly located on the annular-groove fixing disk 40 within the hollow ring 41, a signal output wire of the Hall element 3 penetrates through the annular-groove fixing disk 40, the Hall element 3 is located at a position which is close to the permanent magnetic blocks 2, namely, the Hall element 3 is located within the circular trajectory 5 where each of the permanent magnetic blocks 2 is, a distance between the Hall element 3 and each of the rotating permanent magnetic blocks 2 is kept to 0.3 cm, such that when each of the rotating permanent magnetic blocks 2 passes through the Hall element 3, the Hall element 3 is capable of generating a corresponding rectangular wave electrical signal for outputting.

A center of the annular-groove rotating disk 1 is provided at the circle center of the circular trajectory 5 where all of the permanent magnetic blocks 2 are for axially connecting with a pedal shaft or wheel shaft of the power assistance bicycle.

[2] The power assistance model processor 21 is a signal form converter adapted for converting rotating digital signals of the annular-groove rotating disk 1 to power assistance model digital signals;

wherein the power assistance model processor 21 comprises an analog-to-digital converting and wave peak recognizing device 22, a power assistance starting point selector 23, a magnetic block rotation rate calculator 24, a power assistance model storage 25 and a power assistance model calculator 26;

the analog-to-digital converting and wave peak recognizing device 22 connected with the sensing element recognizes a wave peak of each of the rectangular waves inputted by the Hall element 3 of the sensing element, converts each of the rectangular wave signals to various digital signals, marks each of the rectangular waves, and outputs magnetic block moving digital signals marked with positions and orders of the magnetic blocks;

the analog-to-digital converting and wave peak recognizing device 22 is connected with the power assistance starting point selector 23 and the magnetic block rotation rate calculator 24, the power assistance starting point selector 23 is connected with the magnetic block rotation rate calculator 24; the magnetic block rotation rate calculator 24 calculates rotation rates of the annular-groove rotating disk 1 via the magnetic block moving digital signals marked with the positions and orders of the magnetic blocks and inputted by the analog-to-digital converting and wave peak recognizing device 22, and converts rotation rate digital signals of the annular-groove rotating disk 1 to the power assistance starting point selector 23, the power assistance starting point selector 23 determines a certain rectangular wave corresponding to one power assistance starting point under a certain rotation rate condition via the magnetic block moving digital signal marked with the positions and orders of the magnetic blocks and the rotation rate digital signal of the annular-groove rotating disk 1, namely, determines a power assistance staring point magnetic block; the power assistance starting point selector 23 completes finding the power assistance staring point magnetic block, that is to say, that determines to apply the power assistance from a certain rectangular wave; accurately, under a certain rate, beginning from a certain magnetic block and a certain position, the annular-groove rotating disk 1 applies the power assistance, or transforms an original power assistance model to a next selected power assistance model for power assistance.

Both the power assistance starting point selector 23 and the magnetic block rotation rate calculator 24 are connected with the power assistance model calculator 26, the power assistance model storage 25 is also connected with the power assistance model calculator 26; the power assistance model calculator 26 selects a certain power assistance model function of the power assistance model storage 25 via the power assistance starting point magnetic block determined by the power assistance starting selector 23 and the rotation rate of the annular-groove rotating disk 1 calculated by the magnetic block rotation rate calculator 24, the power assistance starting point magnetic block and the rotation rate of the annular-groove rotating disk 1 are inputted into the power assistance model function to calculate a power assistance model digital signal under these two conditions, that is to say, that the power assistance model calculator 26 outputs the power assistance model digital signals.

[3] The digital-to-analog converter 27 is adapted for converting the power assistance model digital signals to power assistance model analog signals.

The power assistance model calculator 26 is connected with the digital-to-analog converter 27, and the digital-to-analog converter 27 converts the power assistance model digital signals of the power assistance model calculator 26 to the power assistance model analog signals for outputting the power assistance model analog signals to a motor controller 29 which is only capable of processing the analog signals.

[4] The operational amplifier 28 is adapted for converting the power assistance model analog signals of the digital-to-analog converter 27 to power assistance model analog signals within a rated voltage range.

The digital-to-analog converter 27 is connected with the operational amplifier 28, the power assistance model analog signals of the digital-to-analog converter 27 resolve the power assistance model problem, but the voltage of the power assistance model signal still can not meet the demand of the motor controller 29. Therefore, the power assistance model analog signals are converted to the power assistance model analog signals needed by the rated voltage range via the operational amplifier 28, and then are transmitted to the motor controller 29, so that the motor controller 29 controls the motor to operate aiming at the power assistance.

Example 2

Figure 2:
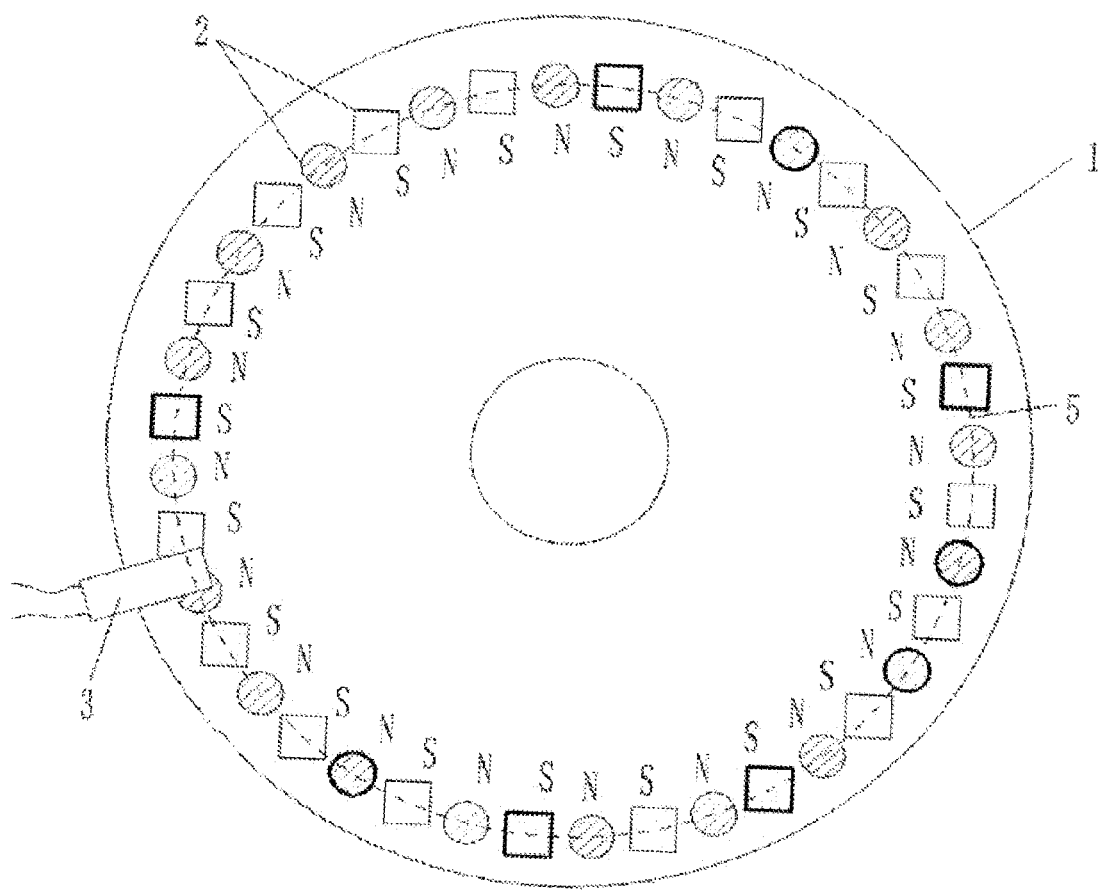
FIG. 2 is a structurally schematic view of a sensing element comprising a plurality of N-S alternating permanent magnetic blocks with high densities which are not evenly distributed on the annular-groove rotating disk, wherein different line thicknesses of the permanent magnetic blocks represent different magnetic fluxes.

A Sensor Having Multiple Magnetic Blocks of Unevenly Distributed Magnetic Fluxes with High Density in a Housing Referring to FIGS. 2, 3 and 4, a surface diameter of the annular-groove rotating disk 1 within the hollow ring 41 is 10.0 cm. Forty permanent magnetic blocks 2, each of which has a diameter of 0.6 cm and a magnetic flux selected from a range of 146-279 (B·H)max/KJ·m$^{-3}$, are arranged on the annular-groove rotating disk 1, and the magnetic fluxes of adjacent permanent magnetic blocks 2 are different. A distance between the Hall element 3 and each of the rotating permanent magnetic blocks 2 is kept to 0.2 cm, such that when each of the rotating permanent magnetic blocks 2 passes through the Hall element 3, the Hall element 3 is capable of generating a corresponding rectangular wave electrical signal for outputting. The structures of the annular-groove rotating disk 1, the permanent magnetic blocks 2 and the Hall element 3 are same as those in Example 1.

Example 3

Figure 5:
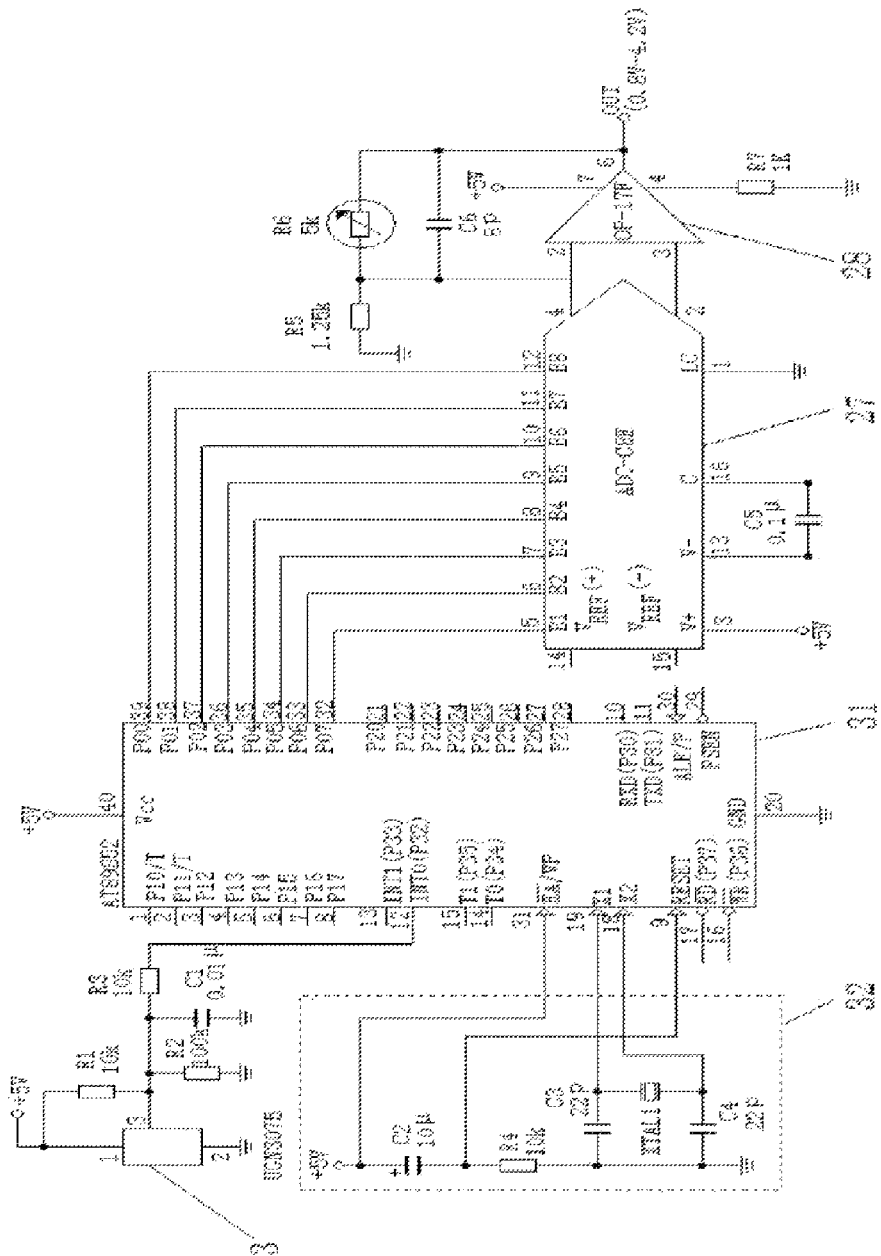
FIG. 5 is a circuit diagram of the Hall element, a single chip microcomputer, the digital-to-analog converter and the operational amplifier.

A Sensor Having Multiple Magnetic Blocks of Unevenly Distributed Magnetic Fluxes with Concrete Circuits in a Housing Referring to FIGS. 1, 3 and 5, the sensor according to the Example 3 comprises a sensing element, a power assistance model processor 21, a digital-to-analog converter 27 and an operational amplifier 28 connected in sequence.

[1] The Hall element 3 is UGN3075; other elements and the structures thereof in the sensing element are same as those in Example 1.

[2] The power assistance model processor 21 selects the single chip microcomputer 31 to complete all functions, the single chip microcomputer 31 is AT89S52, that is to say, that the single chip microcomputer 31 AT89S52 completes all functions of the analog-to-digital converting and wave peak recognizing device 22, the power assistance starting point selector 23, the magnetic block rotation rate calculator 24, the power assistance model storage 25 and the power assistance model calculator 26.

[3] The digital-to-analog converter 27 is ADC-C8E.

[4] The operational amplifier 28 is OF-17F, a thermal resistor R6 with a resistance of 5 k is connected between an input pin 2 and an output pin 6 of the OF-17F operational amplifier 28; two ends of the thermal resistor R6 are connected with a capacitor C6 with a capacitance of 8P in parallel. A resistor R5 with a resistance of 1.25 k is connected between a pin 4 of the digital-to-analog converter 27 and the pin 2 of the operational amplifier 28 for grounding, in such a manner that a voltage range of the analog signals outputted by the pin 6 of the operational amplifier 28 is capable of being adjusted by the thermal resistor R6 to 0.8~4.2V.

The connection relationships of electrical components are as follows:

an output pin 3 of the Hall element 3 is connected to a pin 12, namely INT0 [P32], of the single chip microcomputer 31;

a pin 39, namely P00, of the single chip microcomputer 31 is connected to a pin 12, namely B8, of the digital-to-analog converter 27;

a pin 38, namely P01, of the single chip microcomputer 31 is connected to a pin 11, namely B7, of the digital-to-analog converter 27;

a pin 37, namely P02, of the single chip microcomputer 31 is connected to a pin 10, namely B6, of the digital-to-analog converter 27;

a pin 36, namely P03, of the single chip microcomputer 31 is connected to a pin 9, namely B5, of the digital-to-analog converter 27;

a pin 35, namely P04, of the single chip microcomputer 31 is connected to a pin 8, namely B4, of the digital-to-analog converter 27;

a pin 34, namely P05, of the single chip microcomputer 31 is connected to a pin 7, namely B3, of the digital-to-analog converter 27;

a pin 33, namely P06, of the single chip microcomputer 31 is connected to a pin 6, namely B2, of the digital-to-analog converter 27;

a pin 32, namely P07, of the single chip microcomputer 31 is connected to a pin 5, namely B1, of the digital-to-analog converter 27;

a pin 4 of the digital-to-analog converter 27 is connected to the pin 2 of the operational amplifier 28;

a pin 2 of the digital-to-analog converter 27 is connected to a pin 3 of the operational amplifier 28; and the pin 6 of the operational amplifier 28 is an analog signal output terminal.

[5] The structural relationships between mechanical parts and sensing parts of the sensor are as follows: the mechanical parts of the sensor are the annular-groove rotating disk 1 and the annular-groove fixing disk 40 engaged with each other; the sensing parts of the sensor are a plurality of permanent magnetic blocks 2, the Hall element 3, the single chip microcomputer 31, the digital-to-analog converter 27, and the operational amplifier 28; wherein among the sensing parts, the Hall element 3, the single chip microcomputer 31, the digital-to-analog converter 27, and the operational amplifier 28, which are connected in sequence, are provided on a circuit board 59; a plurality of permanent magnetic blocks 2 are provided on an internal wall of the annular-groove rotating disk 1 of the hollow ring 41, and the circuit board 59 is fixed on an internal wall of the annular-groove fixing disk 40 of the hollow ring 41; the Hall element 3 on the circuit board 59 is provided at a position where the Hall element 3 senses magnetic fluxes of the permanent magnetic blocks 2 and outputs changed electrical signals according to changed magnetic fluxes. The sensing parts are sensing functional parts of the sensor. The mechanical parts have two functions: firstly, keeping relative positions of the elements of the sensing parts for forming a sensing functional integral with the elements; secondly, mounting the sensing functional integral on an electric bicycle and enabling the sensing functional integral to sense a moving state of the electric bicycle. Providing the Hall elements 3, the single chip microcomputer 31, the digital-to-analog converter 27, and the operational amplifier 28, which are connected in sequence, on the circuit board 59 is conducive to integration, modularization and miniaturization thereof, as well as mounting the four elements on the internal wall of the annular-groove fixing disk 40 of the hollow ring 41 as a whole, for simplifying manufacturing of the sensor.

What is claimed is:

1. A sensor having multiple magnetic blocks of unevenly distributed magnetic fluxes in a housing, comprising: a sensing element, a power assistance model processor (21), a digital-to-analog converter (27) and an operational amplifier (28) connected in sequence, and characterized in that: the sensing element is adapted for transforming rotational motions of an annular-groove rotating disk (1) to rectangular wave output signals;

wherein the sensing element comprises the annular-groove rotating disk (1), an annular-groove fixing disk (40), a Hall element (3) and a plurality of permanent magnetic blocks (2); a concave of the annular-groove rotating disk (1) is opposite to that of the annular-groove fixing disk (40), and the annular-groove fixing disk (40) is engaged with an annular groove of the annular-groove rotating disk (1) to form a fitting interior-empty housing in which two disks are capable of relatively rotating with each other, the concave of the annular-groove rotating disk (1) and that of the annular-groove fixing disk (40) form a hollow ring (41); the plurality of permanent magnetic blocks (2) are fixedly arranged on a portion of the annular-groove rotating disk (1) within the hollow ring (41), and the plurality of permanent magnetic blocks (2) are evenly distributed along a circular trajectory, that is to say, that a distance from each of the permanent magnetic blocks (2) to a circle center of the circular trajectory (5) is same, and a distance between every two adjacent permanent magnetic blocks (2) is same; magnetic polarities of every two adjacent permanent magnetic blocks (2) are opposite, the magnetic polarities of all of the permanent magnetic blocks (2) on the annular-groove rotating disk (1) are distributed in a pattern of pole N, pole S, pole N, pole S, pole N, pole S . . . ; magnetic fluxes of at least two of the permanent magnetic blocks (2) are different;

the Hall element (3) is fixedly located on a portion of the annular-groove fixing disk (40) within the hollow ring (41), and is located at a position which is close to the permanent magnetic blocks (2) and capable of inducting the magnetic flux of each of the permanent magnetic blocks (2), a distance is provided between the Hall element (3) and the permanent magnetic blocks (2); the Hall element (3) is adapted for generating the rectangular wave output signals aiming at two opposite magnetic polarities;

the power assistance model processor (21) is a signal form converter adapted for converting rotating digital signals of the annular-groove rotating disk (1) to power assistance model digital signals;

wherein the power assistance model processor (21) comprises an analog-to-digital converting and wave peak recognizing device (22), a power assistance starting point selector (23), a magnetic block rotation rate calculator (24), a power assistance model storage (25) and a power assistance model calculator (26);

the analog-to-digital converting and wave peak recognizing device (22) connected with the sensing element recognizes a wave peak of each of the rectangular waves inputted by the Hall element (3) of the sensing element, converts each of the rectangular wave signals to various digital signals, marks each of the rectangular waves, and outputs magnetic block moving digital signals marked with positions and orders of the magnetic blocks;

the analog-to-digital converting and wave peak recognizing device (22) is connected with the power assistance starting point selector (23) and the magnetic block rotation rate calculator (24), the power assistance starting point selector (23) is connected with the magnetic block rotation rate calculator (24); the magnetic block rotation rate calculator (24) calculates rotation rates of the annular-groove rotating disk (1) via the magnetic block moving digital signals marked with the positions and orders of the magnetic blocks and inputted by the analog-to-digital converting and wave peak recognizing device (22), and converts rotation rate digital signals of the annular-groove rotating disk (1) to the power assistance starting point selector (23), the power assistance starting point selector (23) determines a certain rectangular wave corresponding to one power assistance starting point under a certain rotation rate condition via the magnetic block moving digital signal marked with the positions and orders of the magnetic blocks and the rotation rate digital signal of the annular-groove rotating disk (1), namely, determines a power assistance staring point magnetic block;

both the power assistance starting point selector (23) and the magnetic block rotation rate calculator (24) are connected with the power assistance model calculator (26), the power assistance model storage (25) is also connected with the power assistance model calculator (26); the power assistance model calculator (26) selects a certain power assistance model function of the power assistance model storage (25) via the power assistance starting point magnetic block determined by the power assistance starting selector (23) and the rotation rate of the annular-groove rotating disk (1) calculated by the magnetic block rotation rate calculator (24), the power assistance starting point magnetic block and the rotation rate of the annular-groove rotating disk (1) are inputted into the power assistance model function to calculate a power assistance model digital signal under these two conditions, that is to say, that the power assistance model calculator (26) outputs the power assistance model digital signals;

the digital-to-analog converter (27) is adapted for converting the power assistance model digital signals to power assistance model analog signals;

wherein the power assistance model calculator (26) is connected with the digital-to-analog converter (27), and the digital-to-analog converter (27) converts the power assistance model digital signals of the power assistance model calculator (26) to the power assistance model analog signals;

the operational amplifier (28) is adapted for converting the power assistance model analog signals of the digital-to-analog converter (27) to power assistance model analog signals within a rated voltage range.

2. The sensor having multiple magnetic blocks of unevenly distributed magnetic fluxes in the housing, as recited in claim 1, further comprising a thermal resistor R6 connected with an input end and an output end of the operational amplifier (28).

3. The sensor having multiple magnetic blocks of unevenly distributed magnetic fluxes in the housing, as recited in claim 2, wherein the power assistance model processor (21) is a single chip microcomputer (31) connected with a clock circuit (32);

wherein structural relationships between mechanical parts and sensing parts of the sensor are as follows: the mechanical parts of the sensor are the annular-groove rotating disk (1) and the annular-groove fixing disk (40) engaged with each other; the sensing parts of the sensor are the plurality of permanent magnetic blocks (2), the Hall element (3), the single chip microcomputer (31), the digital-to-analog converter (27), and the operational amplifier (28); wherein among the sensing parts, the Hall element (3), the single chip microcomputer (31), the digital-to-analog converter (27), and the operational amplifier (28), which are connected in sequence, are provided on a circuit board (59); the plurality of permanent magnetic blocks (2) are provided on an internal wall of the annular-groove rotating disk (1) of the hollow ring (41), and the circuit board (59) is fixed on an internal wall of the annular-groove fixing disk (40) of the hollow ring (41); the Hall element (3) on the circuit board (59) is provided at a position where the Hall element (3) senses magnetic fluxes of the permanent magnetic blocks (2) and outputs changed electrical signals according to changed magnetic fluxes.

4. The sensor having multiple magnetic blocks of unevenly distributed magnetic fluxes in the housing, as recited in claim 3, wherein the Hall element (3) is UGN3075, the power assistance model processor (21) is the AT89S52 single chip microcomputer (31), the digital-to-analog converter (27) is ADC-C8E, the operational amplifier (28) is OF-17F, the thermal resistor R6 is connected between an input pin 2 and an output pin (6) of the OF-17F operational amplifier (28); wherein the connection relationship thereof are as follows:

an output pin 3 of the Hall element (3) is connected to a pin 12, namely INTO [P32], of the single chip microcomputer (31);

a pin 39, namely P00, of the single chip microcomputer (31) is connected to a pin 12, namely B8, of the digital-to-analog converter (27);

a pin 38, namely P01, of the single chip microcomputer (31) is connected to a pin 11, namely B7, of the digital-to-analog converter (27);

a pin 37, namely P02, of the single chip microcomputer (31) is connected to a pin 10, namely B6, of the digital-to-analog converter (27);

a pin 36, namely P03, of the single chip microcomputer (31) is connected to a pin 9, namely B5, of the digital-to-analog converter (27);

a pin 35, namely P04, of the single chip microcomputer (31) is connected to a pin 8, namely B4, of the digital-to-analog converter (27);

a pin 34, namely P05, of the single chip microcomputer (31) is connected to a pin 7, namely B3, of the digital-to-analog converter (27);

a pin 33, namely P06, of the single chip microcomputer (31) is connected to a pin 6, namely B2, of the digital-to-analog converter (27);

a pin 32, namely P07, of the single chip microcomputer (31) is connected to a pin 5, namely B1, of the digital-to-analog converter (27);

a pin 4 of the digital-to-analog converter (27) is connected to the pin 2 of the operational amplifier (28);

a pin 2 of the digital-to-analog converter (27) is connected to a pin 3 of the operational amplifier (28); and the pin 6 of the operational amplifier (28) is an analog signal output terminal.

5. The sensor having multiple magnetic blocks of unevenly distributed magnetic fluxes in the housing, as recited in claim 4, wherein a bearing (42) is provided between an external surface of an internal ring of the annular-groove fixing disk (40) and an internal surface of an internal ring of the annular-groove rotating disk (1).

6. The sensor having multiple magnetic blocks of unevenly distributed magnetic fluxes in the housing, as recited in claim 4, wherein the Hall element (3) is provided between an internal circular trajectory and an external circular trajectory.

7. The sensor having multiple magnetic blocks of unevenly distributed magnetic fluxes in the housing, as recited in claim 6, wherein a center of the annular-groove rotating disk (1) is provided within the internal circular trajectory of the plurality of permanent magnetic blocks (2).

8. The sensor having multiple magnetic blocks of unevenly distributed magnetic fluxes in the housing, as recited in claim 4, wherein a magnetic flux of at least one of the permanent magnetic blocks (2) is different from that of any other permanent magnetic blocks (2).

9. The sensor having multiple magnetic blocks of unevenly distributed magnetic fluxes in the housing, as recited in claim 8, wherein the annular-groove rotating disk (1) is a plate made of non-magnetic plastic, aluminum or copper.

10. The sensor having multiple magnetic blocks of unevenly distributed magnetic fluxes in the housing, as recited in claim 3, wherein a bearing (42) is provided between an external surface of an internal ring of the annular-groove fixing disk (40) and an internal surface of an internal ring of the annular-groove rotating disk (1).

11. The sensor having multiple magnetic blocks of unevenly distributed magnetic fluxes in the housing, as recited in claim 3, wherein the Hall element (3) is provided between an internal circular trajectory and an external circular trajectory.

12. The sensor having multiple magnetic blocks of unevenly distributed magnetic fluxes in the housing, as recited in claim 11, wherein a center of the annular-groove rotating disk (1) is provided within the internal circular trajectory of the plurality of permanent magnetic blocks (2).

13. The sensor having multiple magnetic blocks of unevenly distributed magnetic fluxes in the housing, as recited in claim 2, wherein a bearing (42) is provided between an external surface of an internal ring of the annular-groove fixing disk (40) and an internal surface of an internal ring of the annular-groove rotating disk (1).

14. The sensor having multiple magnetic blocks of unevenly distributed magnetic fluxes in the housing, as recited in claim 2, wherein the Hall element (3) is provided between an internal circular trajectory and an external circular trajectory.

15. The sensor having multiple magnetic blocks of unevenly distributed magnetic fluxes in the housing, as recited in claim 14, wherein a center of the annular-groove rotating disk (1) is provided within the internal circular trajectory of the plurality of permanent magnetic blocks (2).

16. The sensor having multiple magnetic blocks of unevenly distributed magnetic fluxes in the housing, as recited in claim 1, wherein a bearing (42) is provided between an external surface of an internal ring of the annular-groove fixing disk (40) and an internal surface of an internal ring of the annular-groove rotating disk (1).

17. The sensor having multiple magnetic blocks of unevenly distributed magnetic fluxes in the housing, as recited in claim 1, wherein the Hall element (3) is provided between an internal circular trajectory and an external circular trajectory.

18. The sensor having multiple magnetic blocks of unevenly distributed magnetic fluxes in the housing, as recited in claim 17, wherein a center of the annular-groove rotating disk (1) is provided within the internal circular trajectory of the plurality of permanent magnetic blocks (2).

19. The sensor having multiple magnetic blocks of unevenly distributed magnetic fluxes in the housing, as recited in claim 1, wherein a magnetic flux of at least one of the permanent magnetic blocks (2) is different from that of any other permanent magnetic blocks (2).

20. The sensor having multiple magnetic blocks of unevenly distributed magnetic fluxes in the housing, as recited in claim 19, wherein the annular-groove rotating disk (1) is a plate made of non-magnetic plastic, aluminum or copper.

* * * * *